United States Patent [19]
Onoda

[11] Patent Number: 6,103,434
[45] Date of Patent: Aug. 15, 2000

[54] ELECTRON BEAM DIRECT DRAWING METHOD, SYSTEM AND RECORDING MEDIUM

[75] Inventor: Naka Onoda, Tokyo, Japan

[73] Assignee: NEC Corporation, Japan

[21] Appl. No.: 09/222,526

[22] Filed: Dec. 28, 1998

[30] Foreign Application Priority Data

Dec. 26, 1997 [JP] Japan ...................... 9-360073

[51] Int. Cl.[7] ....................................... G03F 9/00
[52] U.S. Cl. ............................................. 430/30; 430/296
[58] Field of Search ........................ 430/296, 30

[56] References Cited

U.S. PATENT DOCUMENTS

| | | | |
|---|---|---|---|
| 5,624,774 | 4/1997 | Okino et al. | 430/296 |
| 5,798,196 | 8/1998 | Okino | 430/296 |
| 5,894,057 | 4/1999 | Yamaguchi et al. | 430/296 |
| 5,935,744 | 8/1999 | Nakajima | 430/296 |

FOREIGN PATENT DOCUMENTS

| | | | |
|---|---|---|---|
| 2-170517 | 7/1990 | Japan | H01L 21/027 |
| 2-271107 | 11/1990 | Japan | H01L 21/027 |
| 4-199612 | 7/1992 | Japan | H01L 21/027 |

*Primary Examiner*—Christopher G. Young
*Attorney, Agent, or Firm*—Hayes, Soloway, Hennessey, Grossman & Hage, P.C.

[57] ABSTRACT

An electron beam direct drawing method has the steps of: converting drawing data for the electron beam direct drawing of a semiconductor device pattern on a chip into a predetermined size and shape; dividing the converted drawing data into multiple fields which are electron beam deflection regions; drawing the drawing data corresponding to each of the divided multiple fields on the chip by step and repeat method; wherein the converted drawing data dividing step is conducted such that the drawing data is divided into the multiple fields on the basis of the chip. Also disclosed is an electron beam direct drawing system which has: a memory which stores drawing data, which is converted into a predetermined size and shape for the electron beam direct drawing of a semiconductor device pattern on a chip; a main body to expose an electron beam on the chip according to the drawing data; a recording medium; and a drawing control section which reads out the drawing data stored in the memory according to a program recorded in the recording medium, divides the drawing data into multiple fields which are electron beam deflection regions, and draws the drawing data corresponding to each of the divided multiple fields on the chip by step and repeat method while exposing an electron beam by the main body; wherein the drawing control section determines the size of the chip and divides the read-out drawing data into multiple fields on the basis of the chip.

2 Claims, 14 Drawing Sheets

DRAWING DATA 1

DRAWING DATA 4

DRAWING DATA 3

DRAWING DATA 2

DRAWING DATA 1

DRAWING DATA 2
(PERIPHERAL CIRCUIT AREA)

DRAWING DATA 2
SHADED AREA : DRAWING DATA 1

IDEAL FIELD SHAPE

BEFORE ADJUSTING DEFLECTION DISTORTION

AFTER ADJUSTING DEFLECTION DISTORTION

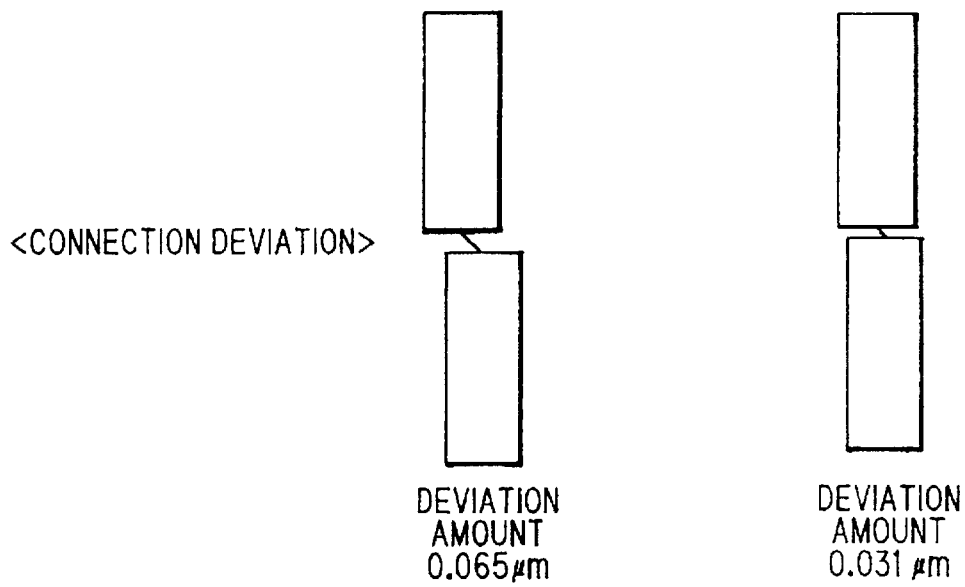
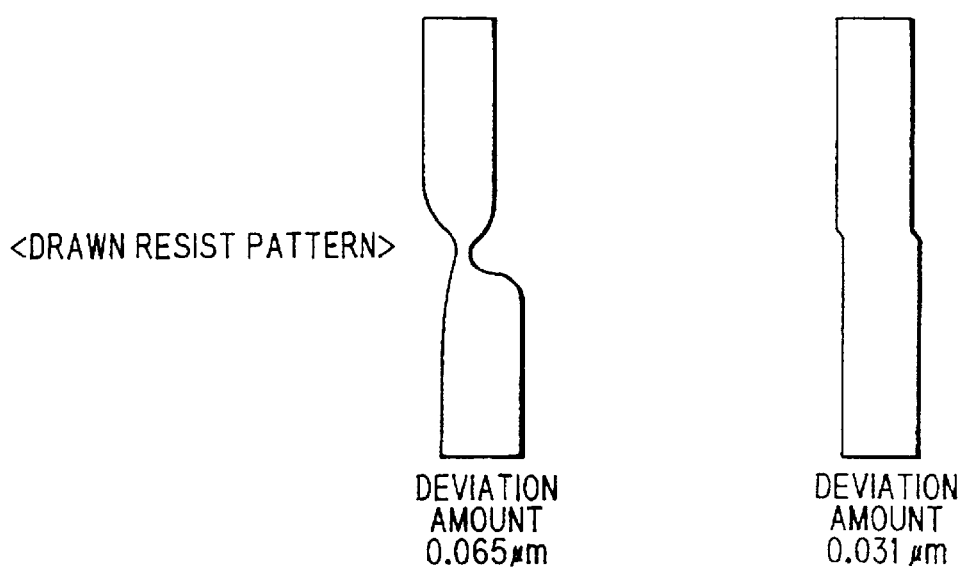

POINT B (0.031μm)

0.05μm

POINT C (0.028μm)

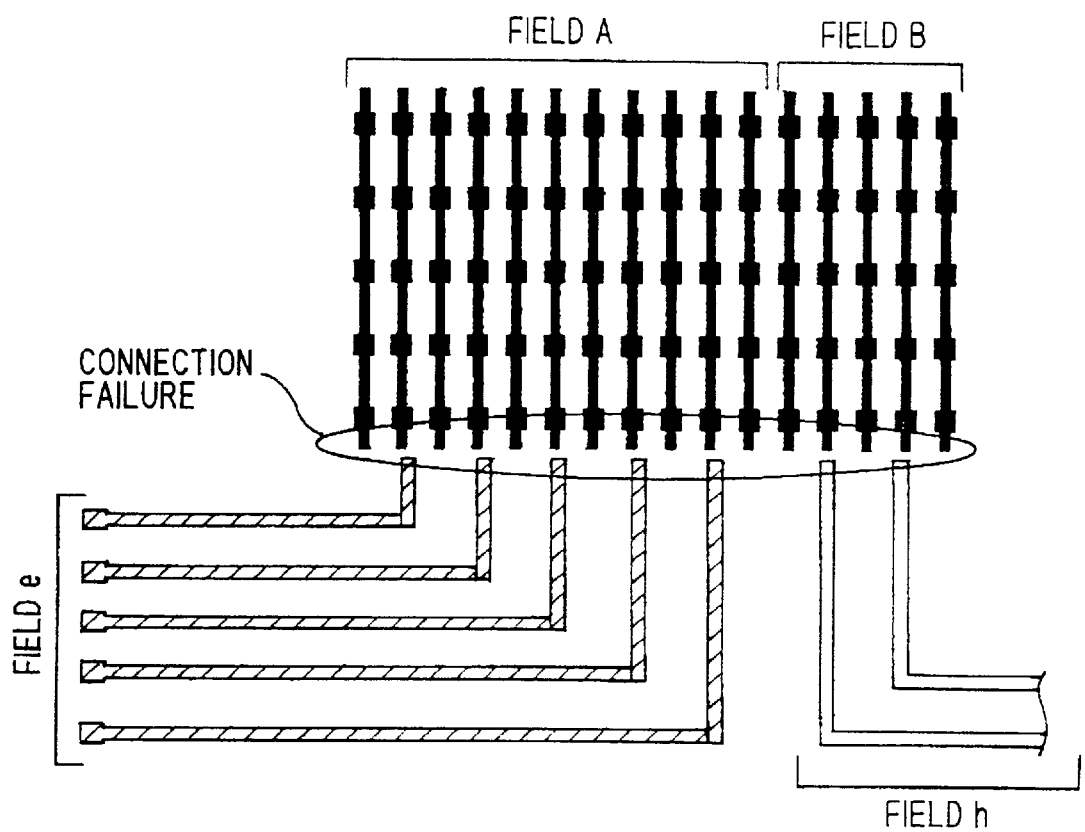

ELECTRON BEAM DIRECT DRAWING METHOD, SYSTEM AND RECORDING MEDIUM

FIELD OF THE INVENTION

This invention relates to an electron beam direct drawing method in which a pattern of a semiconductor device is directly drawn on a sample (wafer) by using the step and repeat drawing method, and more particularly to, an electron beam direct drawing method in which, when there are multiple drawing data in a semiconductor chip, drawing is conducted dividing into fields where an electron beam can be electrically deflected, and also relates to a system and a recording medium used for such a method.

BACKGROUND OF THE INVENTION

For semiconductor integrated circuit, especially custom LSI, a variety of logic's are required depending on customers, and to shorten the period from receipt of order to delivery of product (shortened TAT(turn-around-time)). However, in conventional stepper exposure, since it is necessary to prepare a mask, it takes a long time for the fabrication process and therefore TAT is difficult to shorten. Also, due to the preparation of mask needed, there is a problem that the cost increases. So, electron beam direct drawing techniques that require no mask are attracting attention. However, in electron beam direct drawing, instead of requiring no mask, drawing data have to be in advance prepared by using CAD etc. Also, to convert the data into a format recognizable by an electron direct drawing system, data conversion is needed. For the data conversion, general-purpose workstations are normally used. Although the conversion time depends on the performance of machine and the amount of data, there occurs a time loss due to this operation. If the preparation of drawing data and the data conversion are conducted after the receipt of an order, TAT becomes difficult to shorten. Therefore, it is desired that, in advance, drawing data are prepared and the data conversion is completed. However, since the drawing data are varied depending on customers, it is impossible, in advance, to prepare the drawing data and to complete the data conversion. So, there has been developed a method where multiple data to each part such as Tr cell, peripheral circuit etc., which are originally a suite of drawing data, are prepared and these data are properly combined and then used to draw an LSI needed. Thereby, the preparation of drawing data and the data conversion can be in advance completed, therefore allowing TAT to be shortened.

FIG. 1 shows an example of such a method. First, there is provided drawing data 1 for a Tr cell, as shown in FIG. 1A. Corresponding to this, there are in advance prepared drawing data 2, 3 and 4 for a peripheral circuits shown in FIGS. 1B 1C and 1D, and their data conversion is completed. By selecting properly the drawing data 2, 3 or 4 for a peripheral circuit, multiple products can be drawn in a short TAT. Thus, when a custom LSI is drawn using electron beam direct drawing, there exist multiple drawing data in the chip.

Next, the operation of drawing such a LSI is explained. First, the drawing of multiple drawing data in the chip by conventional step and repeat (hereinafter referred to as 'S & R') method is explained in FIG. 2. Since, in electron beam direct drawing, the distance that beam can be stably electrically deflected is limited, the chip (drawing data) is divided into fields 72 a size that a beam can be stably deflected, and these fields 72 are combined together to achieve the drawing. In the process of drawing, field center position 73 is moved in directions 74 and 75 to locate at just under the beam (at a position with zero amount of beam deflection) by using the stage, and the stage is stopped at the position. Then, at that position, electron beam 76 is electrically deflected to draw a pattern within the field. This operation is repeated to draw the pattern within each field.

Next, the method of dividing into fields for drawing data is explained. FIG. 3 is the block diagram showing a conventional electron beam direct drawing system. An electron beam direct drawing system 80 is composed of a memory 83, a main body 84 and a drawing control section 85. First, drawing data 81 prepared by using CAD etc. is converted into a format recognizable by the electron beam direct drawing system 80. Then, the drawing data 82 is converted and is transferred and stored in the memory 83 of the electron beam direct drawing system 80. Then, the drawing control section 85 reads the drawing data 82 stored in the memory 83 and divides the drawing data 82 into fields. In the process of dividing, the size of drawing data only is considered. Therefore, the drawing is performed while dividing the drawing data into arbitrary fields and conducting the S&R operation.

Even when there are multiple drawing data in the chip, the same drawing operation is performed. For example, the field dividing operation in case of two drawing data is shown in FIGS. 4A to 4E. The drawing data 81 is of drawing data 1 (Tr cell) shown in FIG. 4B and drawing data 2 (peripheral circuit) shown in FIG. 4C, where the sizes of the drawing data are different. The respective drawing data are, as shown in FIGS. 4D and 4E, overlapped on the sample to form one chip.

First, drawing data 1, 2 are stored in memories 1, 2 of the memory 83 in FIG. 4A. Then, drawing data 1 is first read from memory 1 and then is, as shown in FIG. 4B, divided into fields A and B to D by the drawing control section 85. Then, drawing data 2 is read from memory 2 and then is, as shown in FIG. 4C, divided into fields e and f to m. Then, drawing data 1, 2 are drawn by S & R drawing operation as described above. The field dividing operation is thus conducted on the basis of each of drawing data. Therefore, as shown in FIG. 4E, the fields A and B to D of drawing data 1 and the fields e and f to m of drawing data 2 are located on the sample such that the fields are partly overlapped.

Next, the process of determining the field size is explained.

The field size is determined by the maximum deflection width in such a range that deflection distortion occurred when electron beam is electrically deflected does not affect the pattern. FIGS. 5A to 5D are illustrations showing deflection distortions within a field. FIG. 5A shows an ideal field shape by a dotted line. In contrast, FIG. 5B shows an actual field shape before adjusting the deflection distortion of beam. The actual field shape before adjusting the deflection distortion of beam has a deflection distortion of 0.065 $\mu$m(point A) at the maximum, comparing with the ideal field shape in FIG. 5A. Since there will occur a failure in pattern connection when the maximum value is 0.065 $\mu$m, the deflection distortion is adjusted before drawing. The process is conducted such that several fields are first laid adjacent to each other as shown in FIG. 5D and then the amount of connection deviation (amount of deflection distortion) at the respective field boundaries is measured. Then, to this distortion, the amount of distortion is approximated by a certain correction formula. From the approximated value, an approximation correction coefficient is generated, and then the correction of distortion is conducted based on this correction coefficient to adjust the boundary connection. However, there occurs a remainder of correction due to a tertiary or higher distortion or a measurement error in measuring the distortion, therefore even after adjusting the deflection distortion, a deflection distortion of 0.031 μm(point B) at the maximum is left as shown in FIG. 5C. However, the connection deviation at field boundary can be corrected to be so smaller than that before the correction. FIGS. 6A to 6D show the case that 0.2 μm patterns are actually connected with each other. When there is a deviation of 0.065 μm as shown in FIG. 6A, a drawing failure, nearly equal to disconnection, occurs in the drawn resist pattern as shown in FIG. 6C.

However, for a deviation of 0.031 μm, such a drawing failure does not occur, as shown in FIG. 6D. The above field connection correction is adjusted at the outermost part of the field (position where beam is most deflected), but like distortion is left also within the field.

Such an example is shown in FIG. 7, where the inside of the field is divided into 25 blocks and the distortion amount at the respective positions inside the field is measured. In this example, there is a connection deviation of 0.031 μm(point B) at the outermost part of the field and there is a connection deviation of 0.028 μm(point C) at the maximum inside the field. Such a deflection distortion left inside the field is caused by the remainder of correction in correcting the deflection distortion and the performance of an amplifier to control the amount of beam deflection. An example of amplifier performance is shown in FIG. 8, where an error of about 0.01μm exists depending on the amount of beam deflection and direction of deflection. Thus, there also occurs deflection distortion inside the field.

In electron-beam-drawing a custom LSI, there are multiple drawing data within a chip, as explained in the above conventional technique. Problems occurring when this chip is drawn by the S & R method are explained below.

When there are drawing data 1, 2 within a chip as shown in FIGS. 4A to 4E, each drawing data is divided into fields. Therefore, as shown in FIG. 9, there must exist fields which overlap partially within the chip. There are some fields which overlap partially, in which field A of drawing data 1 and field e of drawing data 2 are included. Problems occurring when fields A and e are electron-beam-drawn are explained below.

As described earlier referring to FIG. 7, there is a distortion of 0.028 μm inside the field even after adjusting the deflection distortion. In this case, the amount of deviation in pattern drawing within field is 0.028 μm at the maximum. Hereupon, as explained earlier referring to FIGS. 6A to 6D, when 0.20 μm patterns are connected with each other, a drawing failure, such as disconnection, in the resist pattern does not occur even for a connection deviation of 0.031 μm. Namely, between patterns within one field, no drawing failure occurs. However, for the chip to be drawn in this example, fields which overlap partially are existing. FIGS. 10A to 10C are enlarged views showing fields A, e which overlap each other. At point D of field A, as shown in FIG. 10A, there is a deflection distortion of 0.028 μm. On the other hand, at point E of field e, as shown in FIG. 10B, there is a deflection distortion of 0.024 μm. While fields A, e with such distortions overlap partially, patterns within field A and patterns within field e are connected on the sample as shown in FIG. 9. When fields A, e are overlapped partially as shown in FIG. 10C, at both point D of field A and point E of field e, there occur distortions in reverse directions on the sample. Therefore, there occurs a deviation amount that the deviation amount (0.028 μm) at point D and the deviation amount (0.024 μm) are added. In this case, the amount of connection deviation can be 0.052 μm (point F) at the maximum. This causes a drawing failure at the connection part between pattern within field A and pattern within field e.

Its actual drawing pattern is shown in FIG. 11, which provides enlarged views of fields A, B, e and h. Since fields A, B and fields e, h each belong to same drawing data, they each are suitably adjacent each other. However, since fields A, e and fields B, h each overlap partially, the connection deviation at the pattern connection parts may increase, thereby causing a drawing failure.

SUMMARY OF THE INVENTION

Accordingly, it is an object of the invention to provide an electron beam direct drawing that no drawing failure due to the connection deviation of patterns may occur even when there are multiple drawing data with different sizes.

It is a further object of the invention to provide an electron beam direct drawing system used to operate such a method.

It is a still further object of the invention to provide a recording medium that a program used to operate such a method is recorded.

According to the invention, an electron beam direct drawing method, comprises the steps of:

converting drawing data for the electron beam direct drawing of a semiconductor device pattern on a chip into a predetermined size and shape;

dividing the converted drawing data into multiple fields which are electron beam deflection regions;

drawing the drawing data corresponding to each of the divided multiple fields on the chip by step and repeat method;

wherein the converted drawing data dividing step is conducted such that the drawing data is divided into the multiple fields on the basis of the chip.

According to another aspect of the invention, an electron beam direct drawing system, comprises:

a memory which stores drawing data, which is converted into a predetermined size and shape, for electron beam direct drawing of a semiconductor device pattern on a chip;

a main body to expose electron beam on the chip according to the drawing data;

a recording medium; and a drawing control section which reads out the drawing data stored in the memory according to a program recorded in the recording medium, divides the drawing data into multiple fields which are electron beam deflection regions, and draws the drawing data corresponding to each of the divided multiple fields on the chip by step and repeat method while exposing electron beam by the main body;

wherein the drawing control section determines the size of the chip and divides the read-out drawing data into multiple fields on the basis of the chip.

According to another aspect of the invention, a recording medium to record a control program for electron beam direct drawing of a semiconductor device pattern on a chip, wherein the control program comprises the execution procedures of:

dividing drawing data, which is converted into a predetermined size and shape, into multiple fields which are electron beam deflection regions on the basis of the chip; and drawing the drawing data corresponding to each of the divided multiple fields on the chip by step and repeat method while exposing electron beam.

BRIEF DESCRIPTION OF THE DRAWINGS

The invention will be explained in more detail in conjunction with the appended drawings, wherein:

FIGS. 6A and 6B are illustrations showing the connection deviation between drawing patterns, FIGS. 6C and 6D are illustrations showing resist patterns drawn corresponding to the drawing patterns in FIGS. 6A and 6B, FIG. 10A shows field A, FIG. 10B shows field e, and FIG. 10C shows an increase in distortion due to the overlapping of fields A and e, FIG. 11 is an illustration showing drawing failures occurring at the pattern connection part between different drawing patterns.

DESCRIPTION OF THE PREFERRED EMBODIMENTS

Figure 1A:
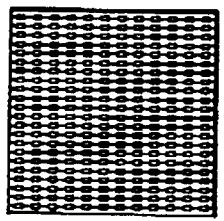
FIG. 1A is an illustration showing an example of drawing data for a Tr all used in electron beam direct drawing.
Figure 1D:
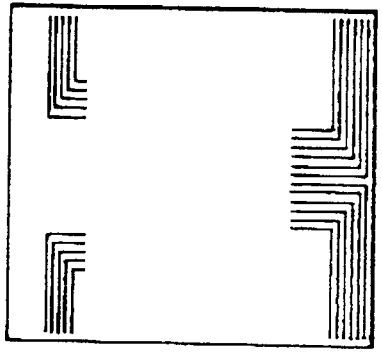
FIGS. 1B to 1D are illustrations showing examples of drawing data for peripheral circuit sections.
Figure 1C:
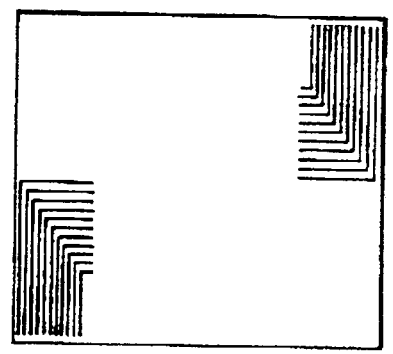
Figure 1B:
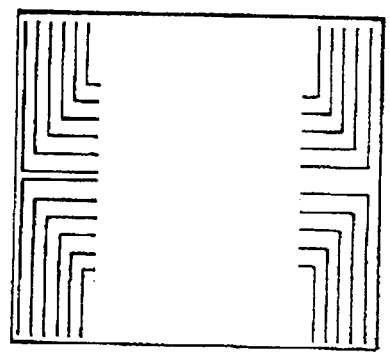
Figure 2:
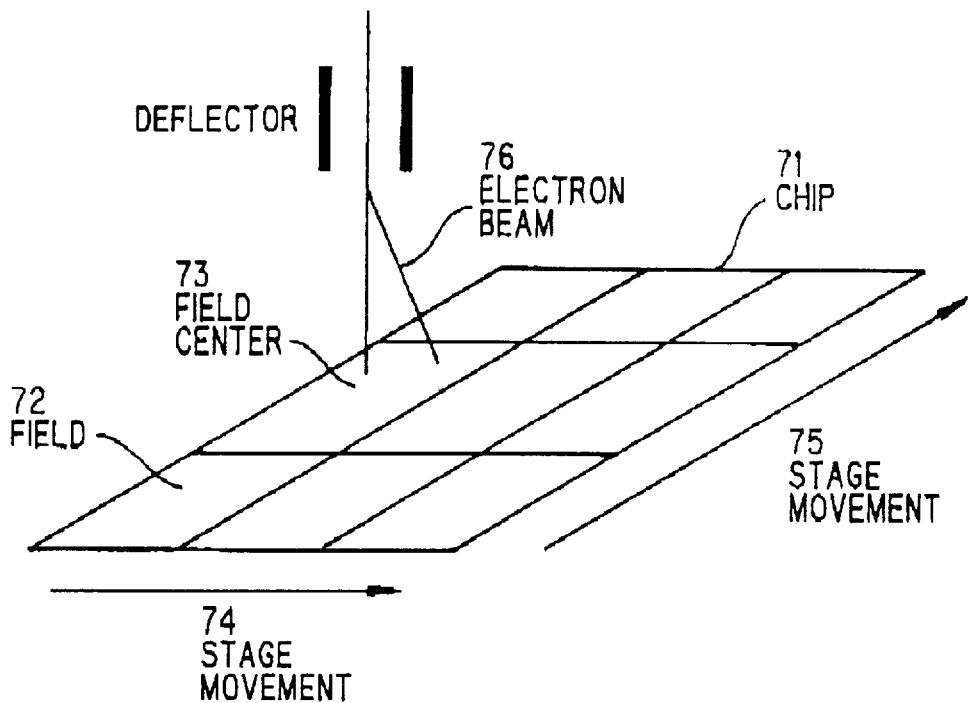
FIG. 2 is an illustration showing an electron beam direct drawing method by S & R.
Figure 3:
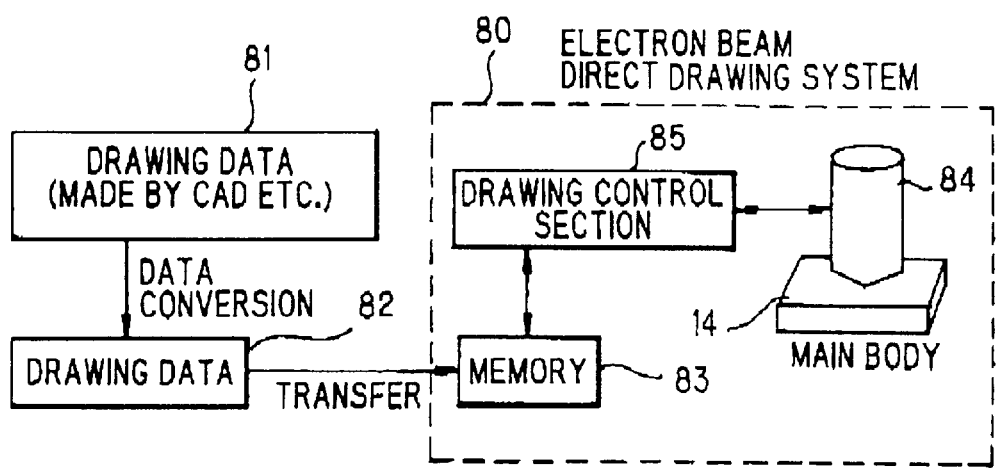
FIG. 3 is a block diagram showing an example of a conventional electron beam direct drawing system.
Figure 4A:
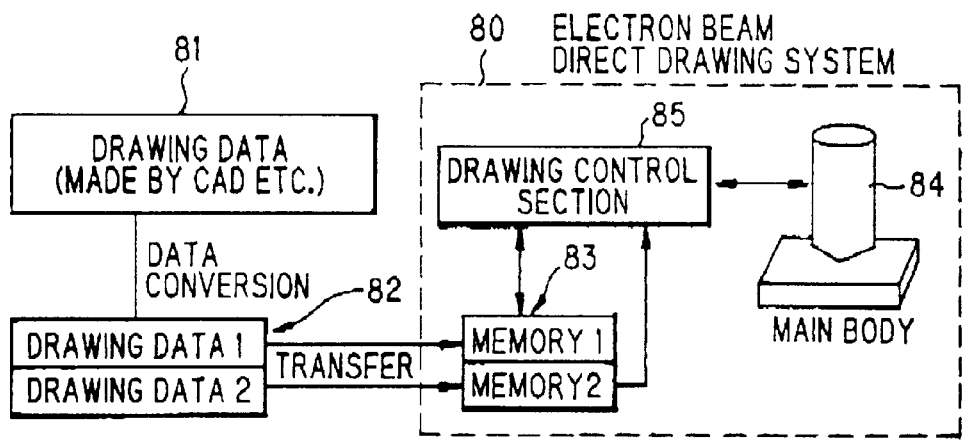
FIG. 4A is a block diagram showing the conventional electron beam direct drawing system of FIG. 3 where two drawing data are drawn.
Figure 4B:
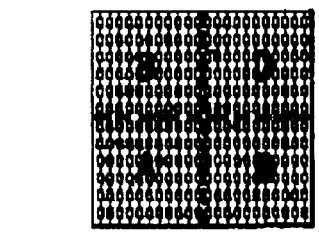
FIG. 4B is an illustration showing drawing data 1 divided into fields.
Figure 4C:
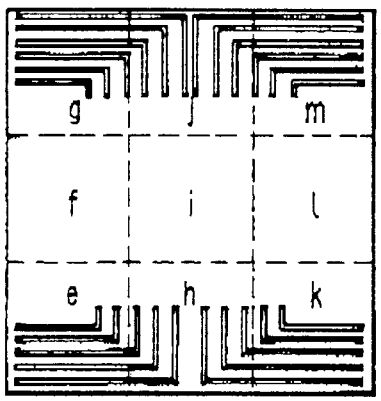
FIG. 4C is an illustration showing drawing data 2 divided into fields.
Figure 4D:
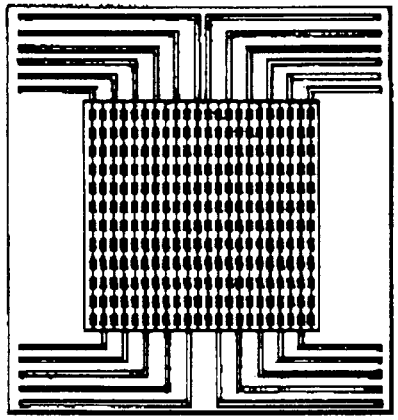
FIG. 4D is an illustration showing the state in which drawing data 1, 2 are drawn on a sample.
Figure 4E:
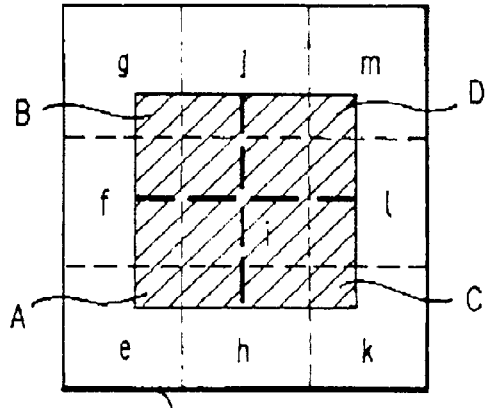
FIG. 4E is an illustration showing the overlapping of fields in FIGS. 4B and 4C, FIGS. 5A to 5D are illustrations showing field distortions due to the deflection of electron beam, where
Figure 5A:
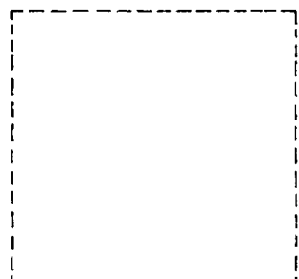
FIG. 5A shows an ideal field shape.
Figure 5B:
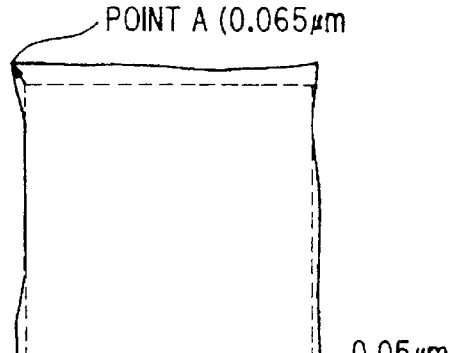
FIG. 5B shows a shape before adjusting the deflection distortion.
Figure 5C:
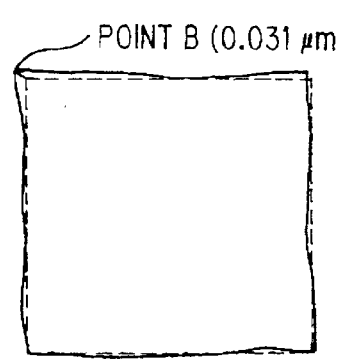
FIG. 5C shows a shape after adjusting the deflection distortion.
Figure 5D:
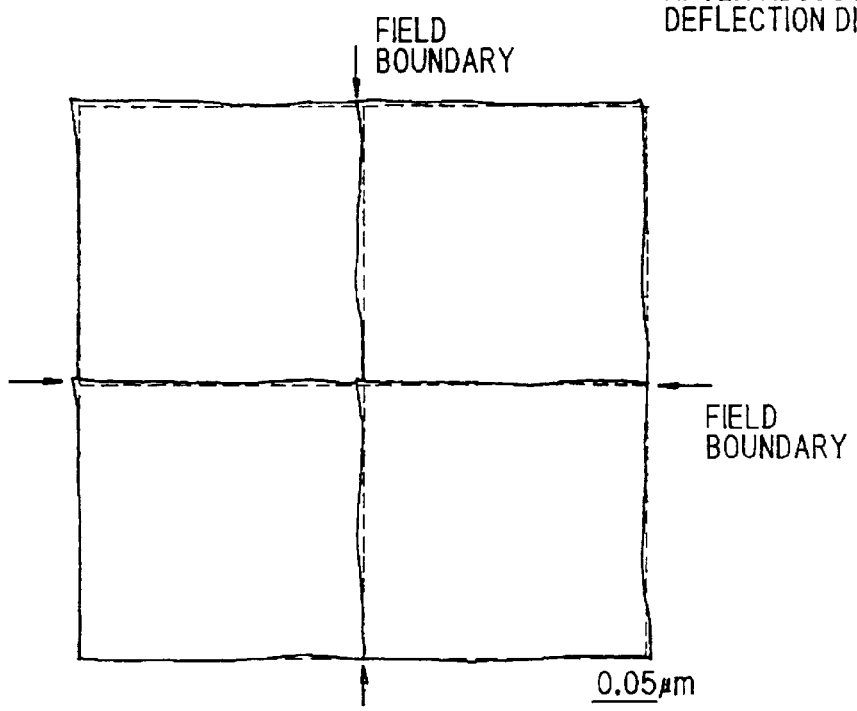
FIG. 5D shows four fields laid adjacent to each other.
Figure 7:
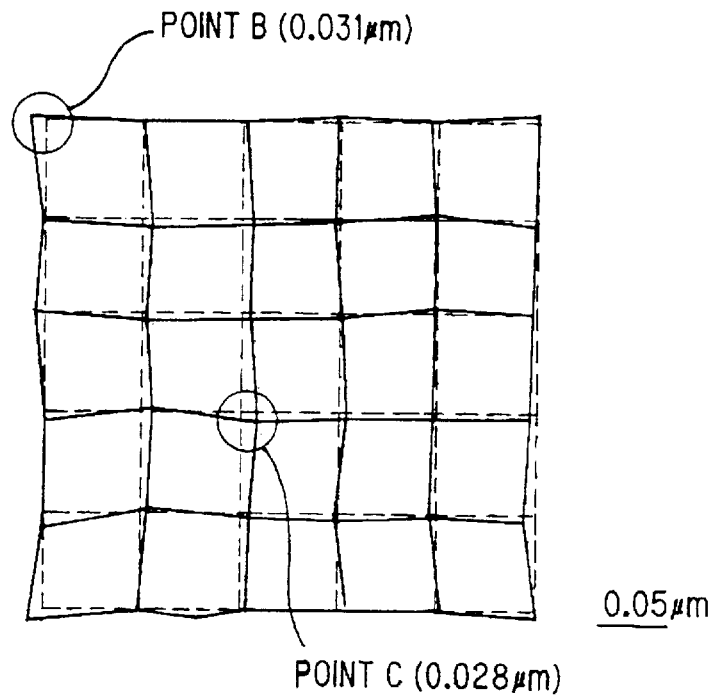
FIG. 7 is an illustration showing deflection distortion inside 25 divided fields.
Figure 8:
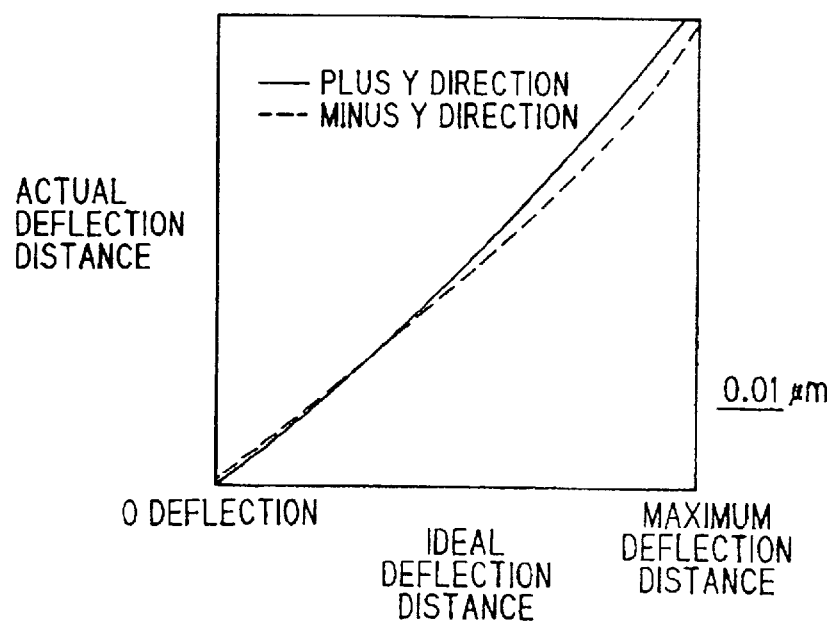
FIG. 8 is a graph showing the performance of a beam deflection control amplifier causing the deflection distortion inside the fields of FIG. 7.
Figure 9:
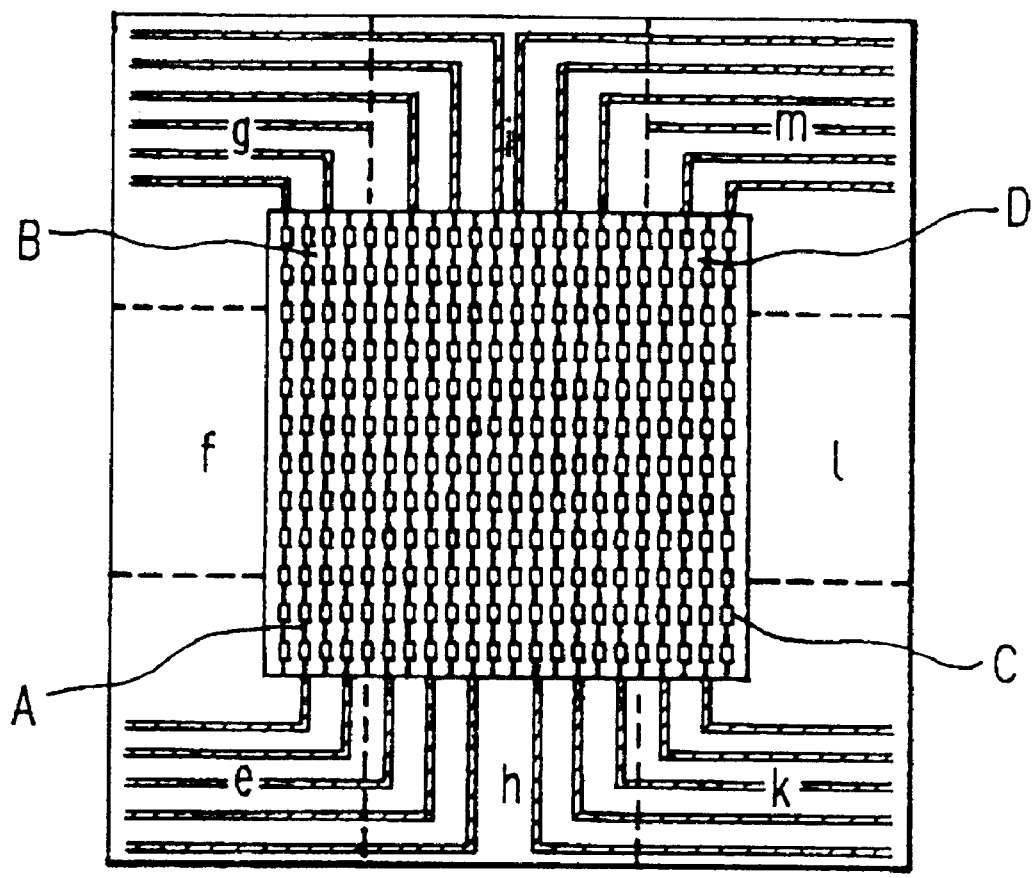
FIG. 9 is an illustration showing the overlapping of drawing data fields inside the chip by a conventional electron beam direct drawing system.
Figure 10A:
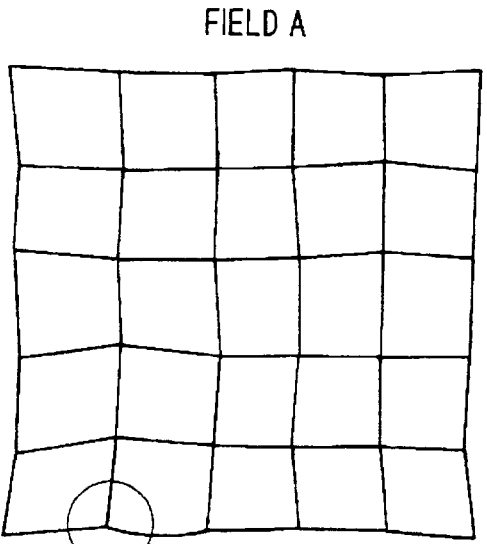
FIGS. 10A to 10C are illustrations showing field deflection distortions, where
Figure 10B:
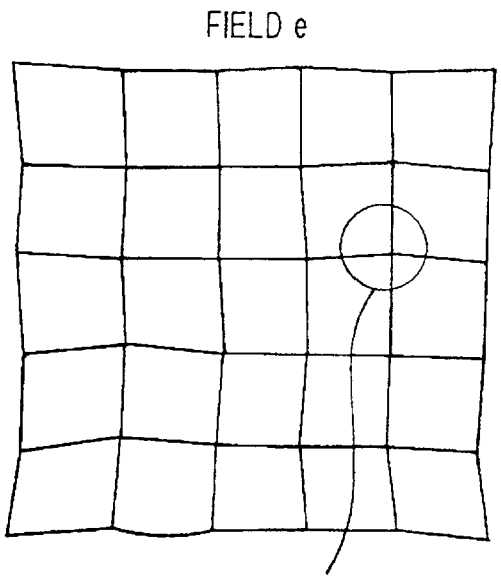
Figure 10C:
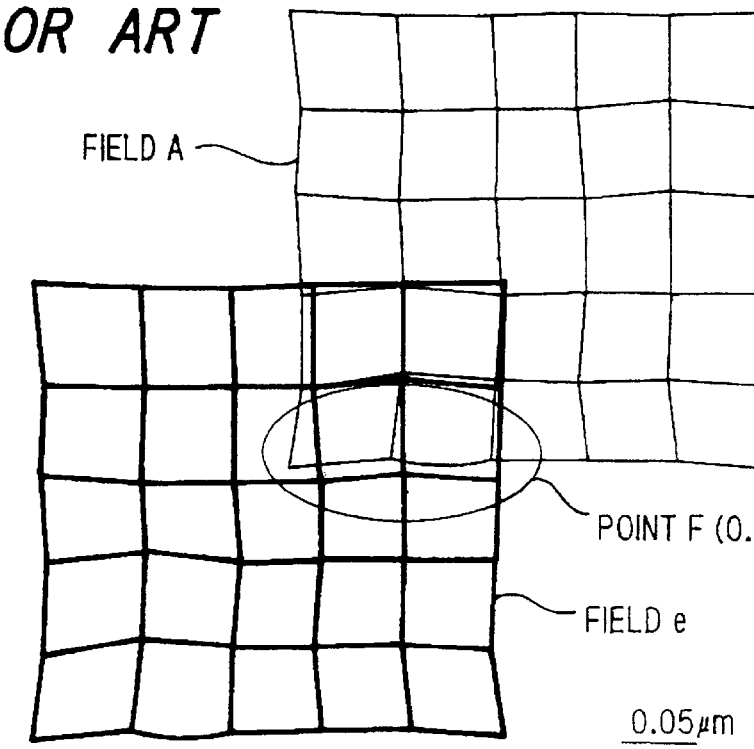

Preferred embodiments of the invention will be explained below, referring to the drawings.

Figure 12:
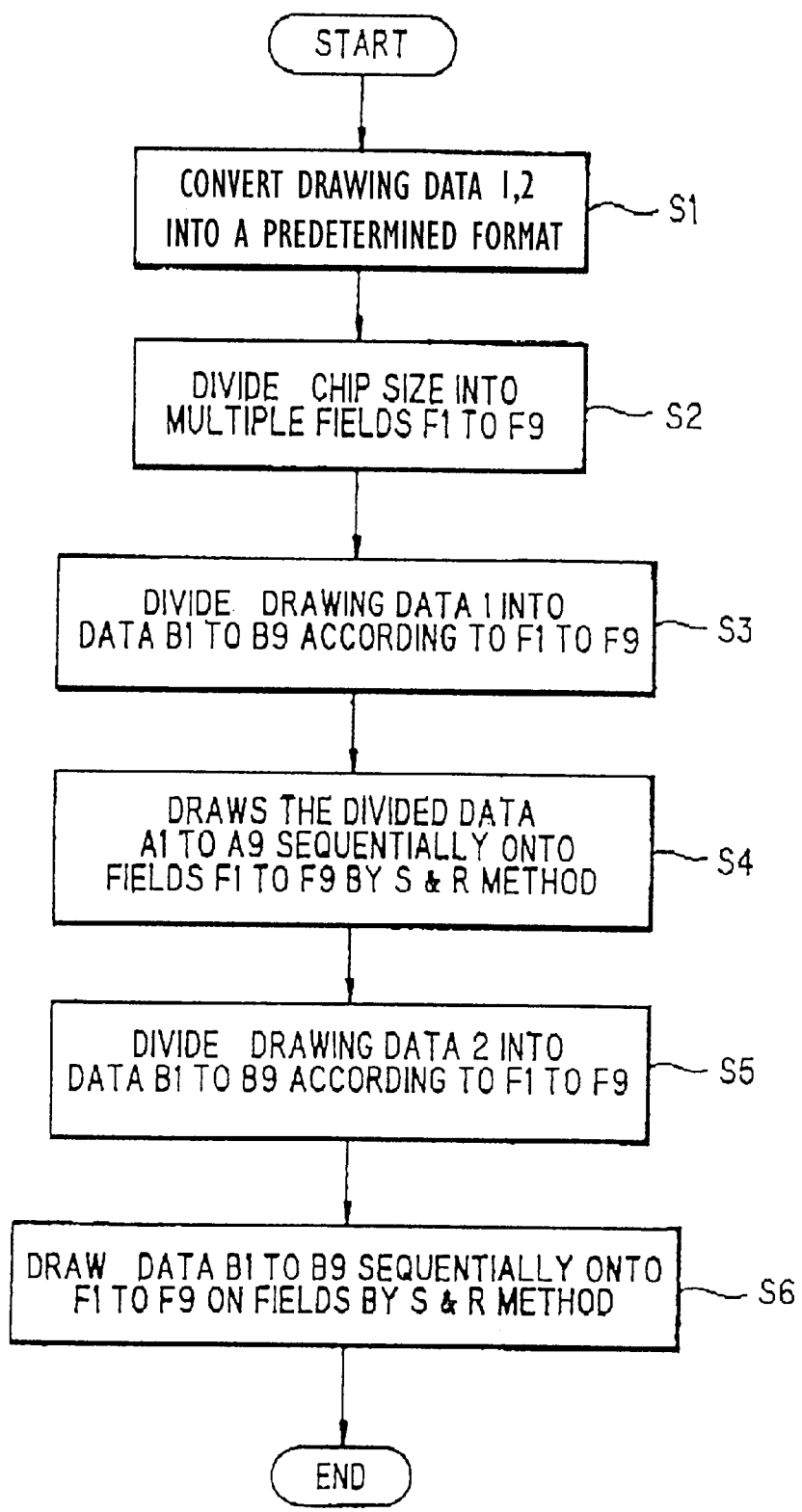
FIG. 12 is a flow chart showing an electron beam direct drawing method in a first preferred embodiment according to the invention.
Figure 13A:
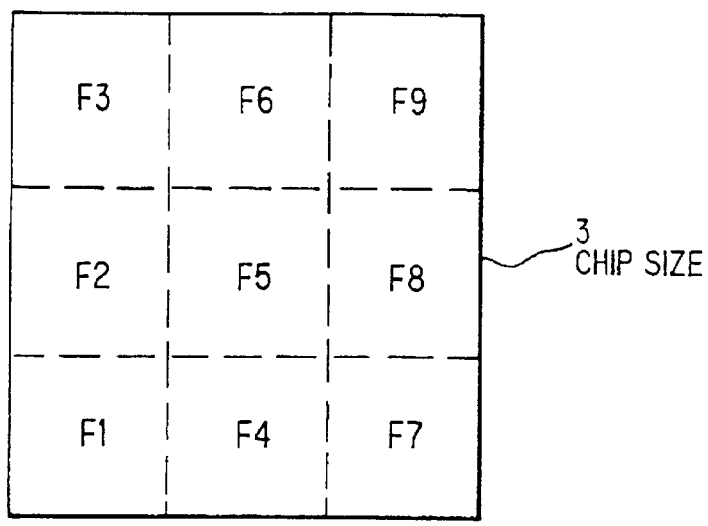
FIG. 13A is an illustration showing chip fields divided at step S2 in FIG. 12.
Figure 13B:
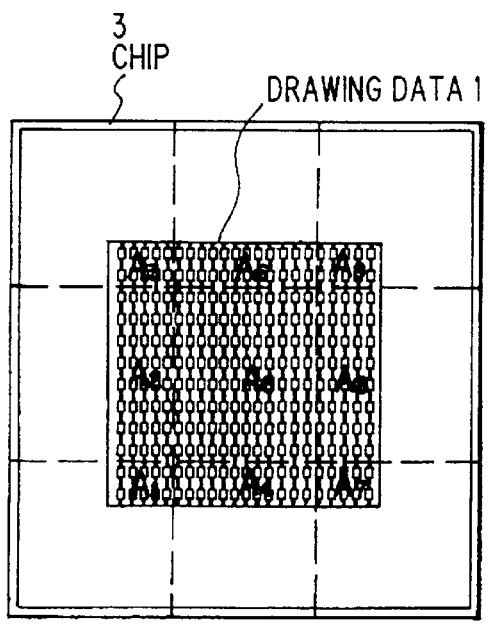
FIG. 13B is an illustration showing the chip fields in FIG. 13A and drawing data 1.
Figure 13C:
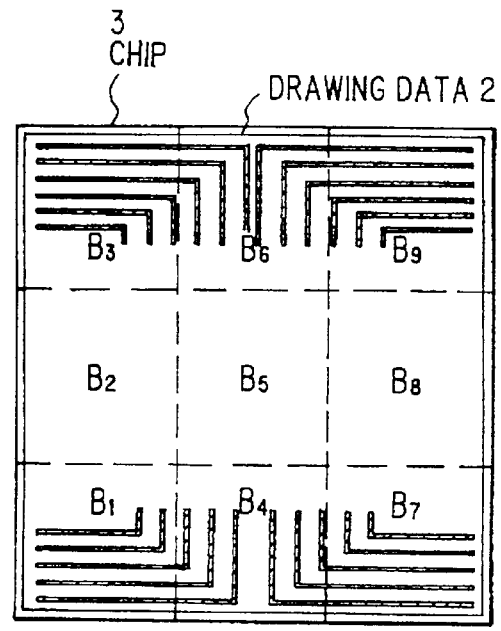
FIG. 13C is an illustration showing the chip fields in FIG. 13A and drawing data 2.
Figure 14:
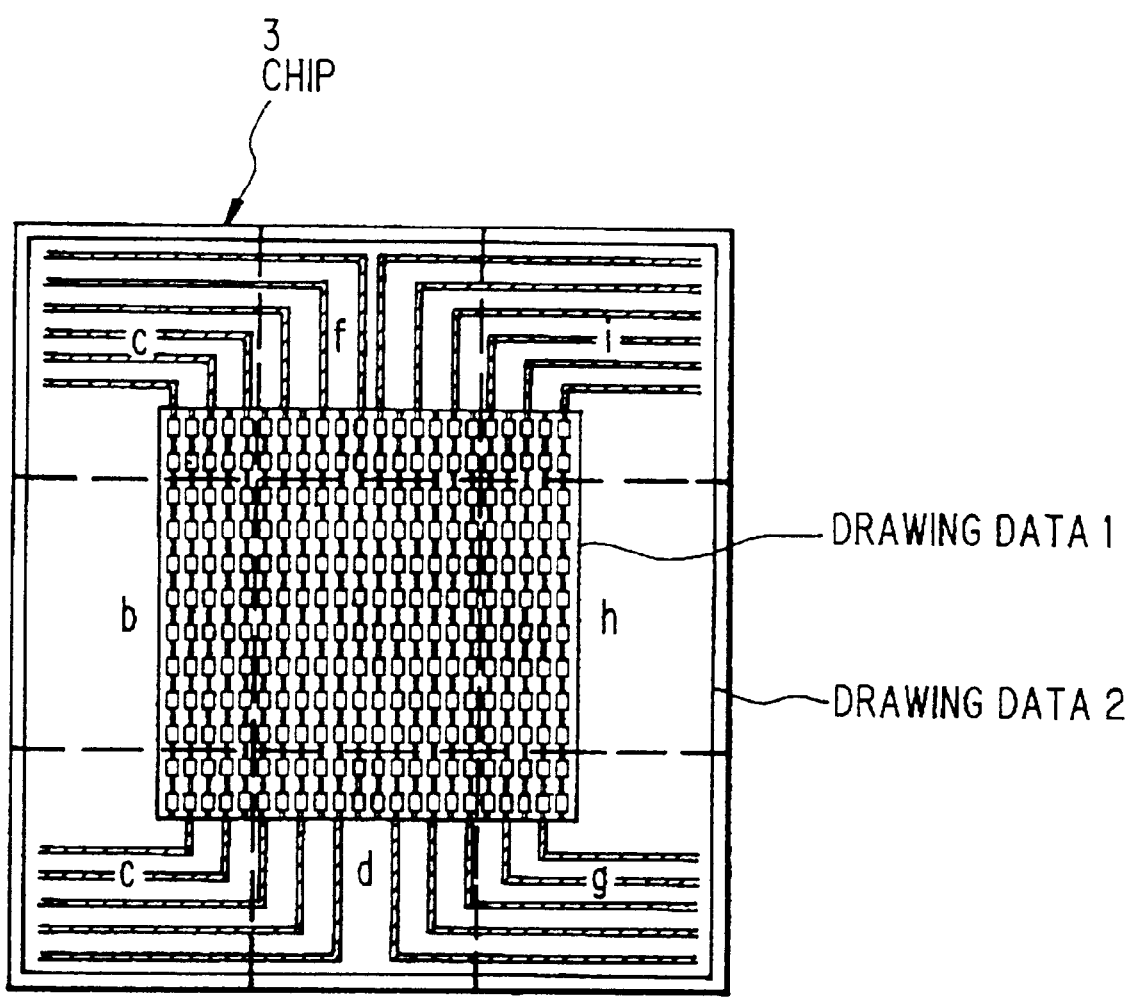
FIG. 14 is an illustration showing the chip fields in FIG.13A and drawing data 1, 2.

FIG. 12 is a flow chart showing an electron beam direct drawing method in the first preferred embodiment according to the invention. FIG. 13A is an illustration showing chip fields to be divided at step S2 of the flow chart in FIG. 12. FIG. 13B is an illustration showing the chip fields in FIG. 13A and drawing data 1. FIG. 13C is an illustration showing the chip fields in FIG. 13A and drawing data 2. FIG. 14 is an illustration showing the chip fields in FIG. 13A and drawing data 1, 2.

In the electron beam direct drawing method in FIG. 12, drawing data 1, 2 which are prepared in advance using CAD etc. are first converted into a predetermined size and shape in electron beam direct drawing (Step S1).

Then, as shown in FIG. 13A, chip size 3 is divided into fields F1, F2, . . . , F9 that are electron beam deflection regions for electron beam direct drawing (Step S2).

Then, as shown in FIG. 13B, drawing data 1 is divided into drawing data A1, A2, . . . , A9 corresponding to fields F1, F2, . . . , F9 in FIG. 13A (Step S3).

Then, the divided drawing data A1, A2, . . . , A9 are drawn on a sample by S & R method (Step S4). At this step, the regions A1, A2, . . . , A9 of drawing data 1 are drawn in the fields F1, F2, . . . , F9, respectively.

Then, as shown in FIG. 13C, drawing data 2 is divided into drawing data B1, B2, . . . , B9 corresponding to fields F1, F2, . . . , F9 (Step S5).

Then, the divided drawing data B1, B2, . . . , B9 are drawn on the sample by S & R method (Step S6). At this step, the regions B1, B2, . . . , B9 of drawing data 2 are drawn in the fields F1, F2, F9, respectively.

In this way, drawing data 1, 2 are drawn on the sample as shown in FIG. 14. Since electron beam deflection exposure from one point only is conducted in respective regions a, b, . . . , i, there is no part where electron beam deflection regions overlap. Therefore, a large connection deviation can be prevented from occurring at pattern connection parts between drawing data 1 and 2, and a good drawing can be thus achieved.

Figure 15:
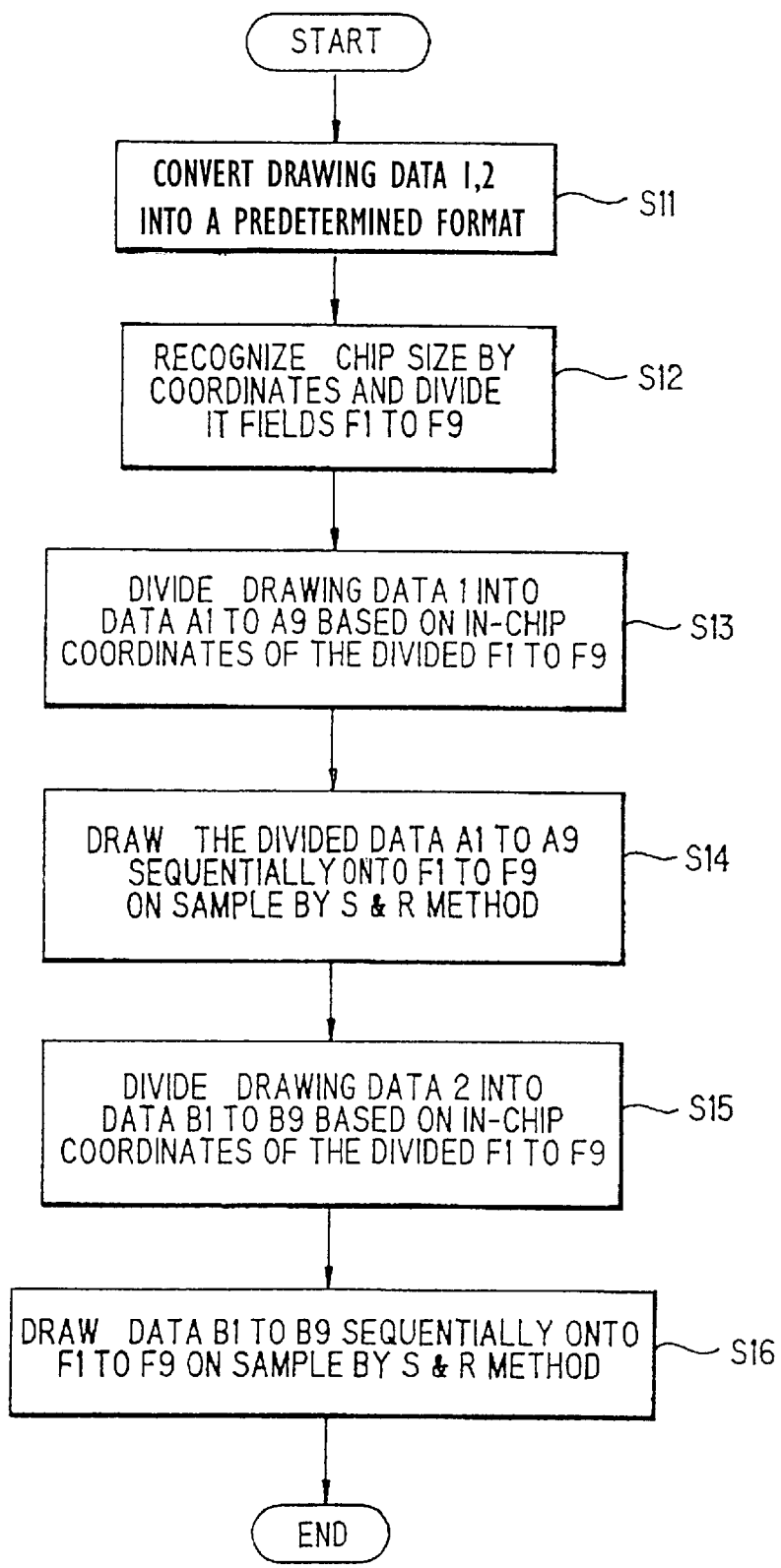
FIG. 15 is a flow chart showing an electron beam direct drawing method in a second preferred embodiment according to the invention.

FIG. 15 is a flow chart showing an electron beam direct drawing method in the second preferred embodiment according to the invention.

The electron beam direct drawing method in FIG. 15 is the same as that in FIG. 12 except that steps S12, S13 and S15 are used therein replacing steps S2, S3 and S5 in FIG. 12.

Namely, at step S12, the coordinates of chip size 3 in FIG. 13A is determined and divided into fields F1, F2, . . . , F9 whose coordinates are also determined.

Then, drawing data 1 is, as shown in FIG. 13B, divided into regions A1, A2, . . . , A9 using the coordinates determined when chip size 3 is divided into fields F1, F2, ..., F9 at step S12 (step S13). Drawing data A1, A2, ..., A9 are used to conduct the sample drawing at step 14.

Then, drawing data 2 is, as shown in FIG. 13C, divided into regions B1, B2, ..., B9 using the coordinates determined when chip size 3 is divided into fields F1, F2, ..., F9 at step S12 (step S15).

Drawing data B1, B2, ..., B9 are used to conduct the sample drawing at step 16.

In this electron beam direct drawing method, the region division of drawing pattern is conducted using the coordinates obtained by dividing into the fields within a chip. Therefore, like the first embodiment, a large connection deviation can be prevented from occurring at pattern connection parts between drawing data 1 and 2, and a good drawing can be thus achieved.

Figure 16A:
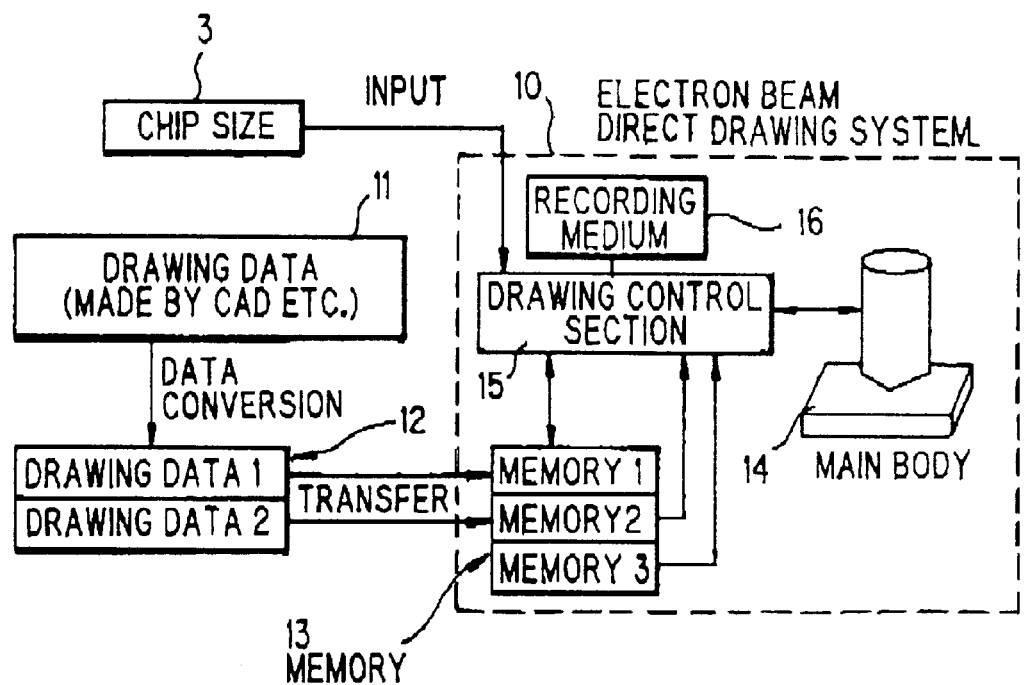
FIG. 16A is a block diagram showing an electron beam direct drawing system in the first preferred embodiment where the electron beam direct drawing method in FIG. 15 is applied.
Figure 16B:
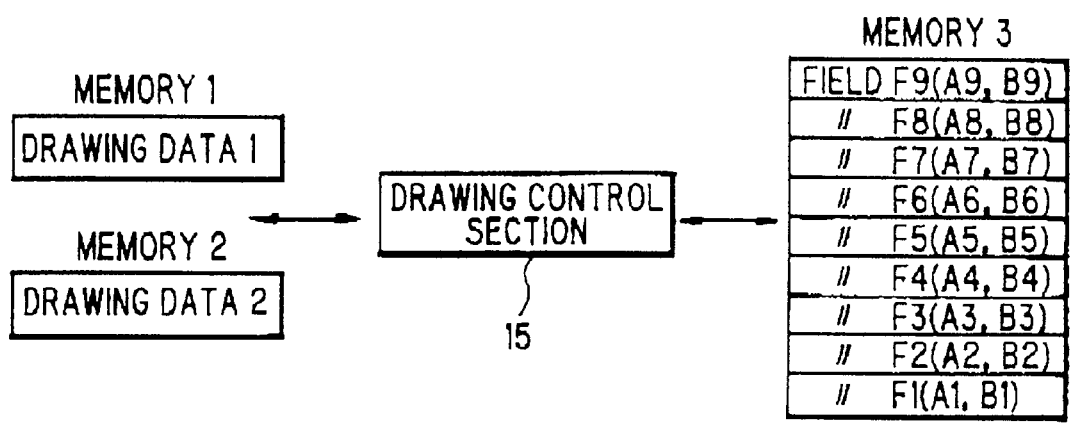
FIG. 16B is an illustration showing the operation of a drawing control section 15 in FIG. 16A.

FIG. 16A is a block diagram showing an electron beam direct drawing system in the first preferred embodiment where the electron beam direct drawing method in FIG. 15 is applied. FIG. 16B is an illustration showing the operation of a drawing control section 15 in FIG. 16A.

The electron beam direct drawing system 10 in FIG. 16A comprises a memory 13, a main body 14 and a drawing control section 15.

The memory 13 is to store drawing data used in electron beam direct drawing. Drawing data 11 prepared in advance by CAD etc. is data-converted (12) into predetermined size and shape by the electron beam direct drawing system 10 by a device (not shown), and drawing data 1, 2 is converted and is transferred and stored into memories 1 and 2, respectively.

The main body 14 receives data used in drawing, and conducts he direct drawing by exposing electron beam on the sample while using his data. The drawing control section 15, to which the chip size is input and by which in-chip coordinates are determined, divides it into fields F1, F2, ..., F9 shown in FIG. 13A for electron beam direct drawing, and stores the divided positional coordinates in memory 3 as shown in FIG. 16B. The drawing control section 15 is a recording medium 16, and conducts the drawing operation while reading drawing data 1, 2 and the respective field coordinates of chip 3 from memory 13 by using a control program recorded in the recording medium 16.

First, drawing data 1 is read from memory 1, the division positional coordinates within the chip are read from memory 3, and drawing data 1 is divided into the regions A1, A2, ..., A9 corresponding to fields F1, F2, ..., F9, as shown in FIG. 13B. Using these drawing data A1, A2, ..., A9, it controls the main body 14 to sequentially draw the sample. Then, drawing data 2 is read from memory 2 and divided into the regions B1, B2, ..., B9 as shown in FIG. 13C. Using these drawing data B1, B2, ..., B9, it controls the main body 14 to sequentially draw the sample.

This electron beam direct drawing system can conduct the direct drawing on the sample using drawing data 1, 2 which are divided corresponding to the chip 3 as shown in FIG. 14. Therefore, a large connection deviation, which may cause disconnection, can be prevented from occurring at pattern connection parts between drawing data 1 and 2, and a good drawing can be thus achieved. By separately preparing in advance drawing data corresponding to a Tr cell and peripheral circuit sections, the device can be quickly produced in response to the demand of customers.

Although in the above embodiments, the number of drawing data is two, it may be n more than 2. Also, although the number of fields into which chip is divided is 9, it may be of course n more than 9.

Advantages of the Invention:

As described above, by dividing the drawing data according to fields by which the chip is divided into multiple parts, even when multiple drawing data are used to conduct the electron beam direct drawing of a sample, a large pattern connection deviation, which may cause disconnection, can be prevented from occurring at the field boundary between the different drawing data, and a good drawing can be thus achieved. For custom LSIs etc., by separately preparing in advance drawing data corresponding to a Tr cell and peripheral circuit sections and combining them, the device can be quickly produced. Thereby, TAT can be shortened.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An electron beam direct drawing method, comprising the steps of:

converting drawing data for the electron beam direct drawing of a semiconductor device pattern on a chip into a predetermined size and shape;

dividing the converted drawing data into multiple fields which are electron beam deflection regions;

drawing said drawing data corresponding to each of the divided multiple fields on said chip by step and repeat method;

wherein said converted drawing data dividing step is conducted such that said drawing data is divided into said multiple fields on the basis of the size and shape of said chip, wherein said converted drawing data dividing step comprises the steps of:

determining the size and shape of chip, dividing said chip size into said multiple fields, determining the in-chip coordinates information of each of the divided fields; and dividing said drawing data into multiple fields on the basis of the determined in-chip coordinates information of each of the divided fields, so that there is no overlap of electron beam deflection regions.

2. A recording medium to record a control program for electron beam direct drawing of a semiconductor device pattern on a chip, wherein:

said control program comprises the steps of:

dividing drawing data, which is converted into a predetermined size and shape, into multiple fields which are electron beam deflection regions on the basis of the size and shape of said chip; and drawing said drawing data corresponding to each of the divided multiple fields on said chip by step and repeat method while exposing electron beam, wherein:

said drawing data dividing procedure comprises the steps of:

determining the size of chip, dividing said chip size into said multiple fields determining the in-chip coordinates information of each of the divided fields; and dividing said drawing data into multiple fields on the basis of the determined in-chip coordinates information of each of the divided fields, so that there is no overlap of electron beam deflection regions.

* * * * *